(12) United States Patent
Bae et al.

(10) Patent No.: US 8,659,530 B2
(45) Date of Patent: Feb. 25, 2014

(54) TIMING CONTROLLER COUNTS CLOCK SIGNALS TO PRODUCE A CONTROL SIGNAL ONLY AFTER A NUMBER OF CLOCK PULSES ARE COUNTED

(75) Inventors: Sang-don Bae, Seoul (KR); Jin-kyu Park, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 648 days.

(21) Appl. No.: 12/020,061

(22) Filed: Jan. 25, 2008

(65) Prior Publication Data
US 2008/0309606 A1   Dec. 18, 2008

(30) Foreign Application Priority Data
Jun. 18, 2007   (KR) .................. 10-2007-0059604

(51) Int. Cl.
*G09G 3/36*   (2006.01)
(52) U.S. Cl.
USPC ............................................................. 345/99
(58) Field of Classification Search
USPC .................................................. 345/87–104
See application file for complete search history.

(56) References Cited

U.S. PATENT DOCUMENTS

| | | | |
|---|---|---|---|
| 6,515,643 B1 * | 2/2003 | Kamiko et al. ............ | 345/87 |
| 6,924,682 B1 * | 8/2005 | Smith ..................... | 327/199 |
| 7,224,298 B2 * | 5/2007 | Lin ........................ | 341/120 |
| 2002/0041280 A1 * | 4/2002 | Woo ....................... | 345/212 |
| 2005/0017990 A1 * | 1/2005 | Yoshida ................... | 345/690 |
| 2005/0210303 A1 | 9/2005 | Ito | |
| 2006/0103432 A1 * | 5/2006 | Rajasekhar et al. ....... | 327/34 |
| 2007/0021846 A1 * | 1/2007 | Huang .................... | 700/12 |
| 2008/0297205 A1 * | 12/2008 | Taylor .................... | 327/97 |

FOREIGN PATENT DOCUMENTS

| | | |
|---|---|---|
| CN | 1099887 | 3/1995 |
| GB | 2303723 | 2/1997 |
| JP | 57-108923 | 7/1982 |
| JP | 61-199321 | 9/1986 |
| JP | 02-170717 | 7/1990 |
| JP | 2003-223263 | 8/2003 |
| JP | 2005-266843 | 9/2005 |
| KR | 100246053 B1 | 12/1999 |
| KR | 1020040062725 A | 7/2004 |
| KR | 100609176 | 12/2004 |
| TW | 200705238 | 2/2009 |

OTHER PUBLICATIONS

European Search Report dated Dec. 15, 2009 in corresponding European Patent Application No. 08005719.3.

(Continued)

*Primary Examiner* — Chanh Nguyen
*Assistant Examiner* — Sanghyuk Park
(74) *Attorney, Agent, or Firm* — F. Chau & Associates, LLC (57) ABSTRACT

A timing controller that can reduce malfunctions, a liquid crystal display (LCD) including the timing controller, and a method of operating the LCD, in which the timing controller includes a counter providing a converting enable signal; an analog-to-digital (A/D) converter converting a user command signal into a digital user command signal in response to the converting enable signal; and a control signal generator generating a module control signal that corresponds to the digital user command signal.

13 Claims, 9 Drawing Sheets

(56) References Cited

OTHER PUBLICATIONS

Sony Corporation: "LCD Digital Colour RV Operating Instructions", Mar. 19, 2007, XP002553131, retrieved from the Internet: URL:http://pdf.crse.com/manuals/2670908141.pdf.

Philips LCD TV—Philips User Manual, Dec. 19, 2005, pp. 1-50, XP002530531, retrieved from the Internet: URL:http://www.p4c.philips.com/files/3/32pf9630a_37/32pg9630a_37_dfu_aen.pdf.

Jack G. Ganssle: "A Guide to Debouncing", The Ganssle Group, Baltimore, MD, Aug. 1, 2004, pp. 1-22, XP002407146.

Wettroth J: "The Dirt on Switching" Electronics World, Nexus Media Communication, Swanley, Kent, GB, vol. 105, No. 1763, Nov. 1, 1999, pp. 938-940, XP000920267, ISSN: 0959-8332.

John Park: "Practical Embedded Controllers: Design and Troubleshooting with the Motorola 68HC11", 2003, Newness, United Kingdom, XP002553132, ISBN: 0750658029, p. 80.

Walt Kester: "Analog-Digital Conversion" 2004, Analog Devices Inc., USA, XP002553133, ISBN: 0916550273, pp. 2.23-2.35.

Analog Devices: "AD7819 Data Sheet Rev. B", Oct. 2000, XP002553134, retrieved from the Internet: URL:http://www.analog.com/static/imported-files/data_sheets/AD7819.pdf.

Analog Devices: "AD7827 Data Sheet Rev.0", Jan. 1998, XP002553135, retrieved from the Internet: URL:http://www.analog.com/static/imported-files/data_sheets/AD7827.pdf.

Moyi Jia, et al., "A practical Controllable Noiseproof Circuit for Button" (Department of Automation, Hebei Institute of Technology), (Jan. 11, 2003), Tangshan, China, pp. 70-71.

Taiwanese Office Action Dated September 23, 2013.

\* cited by examiner

TIMING CONTROLLER COUNTS CLOCK SIGNALS TO PRODUCE A CONTROL SIGNAL ONLY AFTER A NUMBER OF CLOCK PULSES ARE COUNTED

This application claims priority from Korean Patent Application No. 10-2007-0059604 filed on Jun. 18, 2007 in the Korean Intellectual Property Office, the disclosure of which is incorporated herein by reference in its entirety.

BACKGROUND OF THE INVENTION

1. Technical Field

The present disclosure relates to a timing controller, a liquid crystal display (LCD) and a method of driving the LCD and, more particularly, to a timing controller that can reduce malfunctions, an LCD including the timing controller, and a method of driving the LCD.

2. Discussion of Related Art

A liquid crystal display (LCD) includes a first display plate having a plurality of pixel electrodes, a second display plate having a plurality of common electrodes, and a dielectrically anisotropic liquid crystal layer injected between the first and second display plates. The LCD displays a desired image by forming an electric field between the pixel electrodes and the common electrodes, adjusting the intensity of the electric field, and thereby controlling the amount of light transmitted through the liquid crystal panel. Because the LCD is not a self light-emitting display, it includes a backlight unit as a light source.

The LCD supports an on-screen display (OSD) function that enables a user to adjust the brightness, size or the like of a screen. For example, when the user manipulates a keypad in order to adjust the brightness of the screen, a timing controller receives a signal from the keypad and recognizes the received signal as a signal for adjusting the brightness. Accordingly, the timing controller adjusts the brightness of the screen by controlling the backlight unit. Then, brightness information adjusted by the user is displayed on the screen, which is part of the OSD function.

If the timing controller wrongly recognizes the signal generated as a result of the manipulation of the keypad by the user, however, it malfunctions.

SUMMARY OF THE INVENTION

Exemplary embodiments of the present invention provide a timing controller that can reduce malfunctions.

Exemplary embodiments of the present invention also provide a liquid crystal display (LCD) that can reduce malfunctions.

Exemplary embodiments of the present invention also provide a method of driving an LCD that can reduce malfunctions.

The objectives of the present invention are not restricted, however, to the ones set forth herein. The above and other objectives of exemplary embodiments of the present invention will become more apparent to one of ordinary skill in the art to which the present invention pertains by referencing the detailed description of the present invention given below.

According to an exemplary embodiment of the present invention, there is provided a timing controller. The timing controller includes a counter providing a converting enable signal; an analog-to-digital (A/D) converter converting a user command signal into a digital user command signal in response to the converting enable signal; and a control signal generator generating a module control signal that corresponds to the digital user command signal.

According to another exemplary embodiment of the present invention, there is provided an LCD. The LCD includes a handling module outputting a user command signal in response to a user's handling; and a timing controller outputting a module control signal in response to a voltage level of the user command signal in a steady-state section, wherein the user command signal includes a transient response section and the steady-state section.

According to another exemplary embodiment of the present invention, there is provided a method of driving an LCD. The method includes outputting a user command signal in response to a user's handling; and outputting a module control signal in response to a voltage level of the user command signal in a steady-state section, wherein the user command signal includes a transient response section and the steady-state section.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

The present invention will now be described more fully with reference to the accompanying drawings, in which exemplary embodiments of the invention are shown. The invention may, however, be embodied in many different forms and should not be construed as being limited to the exemplary embodiments set forth herein; rather, these exemplary embodiments are provided so that this disclosure will be thorough and complete, and will fully convey the concept of the invention to those of ordinary skill in the art. Like reference numerals in the drawings denote like elements, and thus their description will be omitted.

As used herein, the term "transient response section" refers to a section in which a signal level of a signal transits from a first voltage level to a second voltage level which is different from the first voltage level. In addition, the term "steady-state section" refers to a section in which a voltage level of a signal is maintained at a constant level, which has a predetermined margin, for a predetermined period of time.

Figure 1:
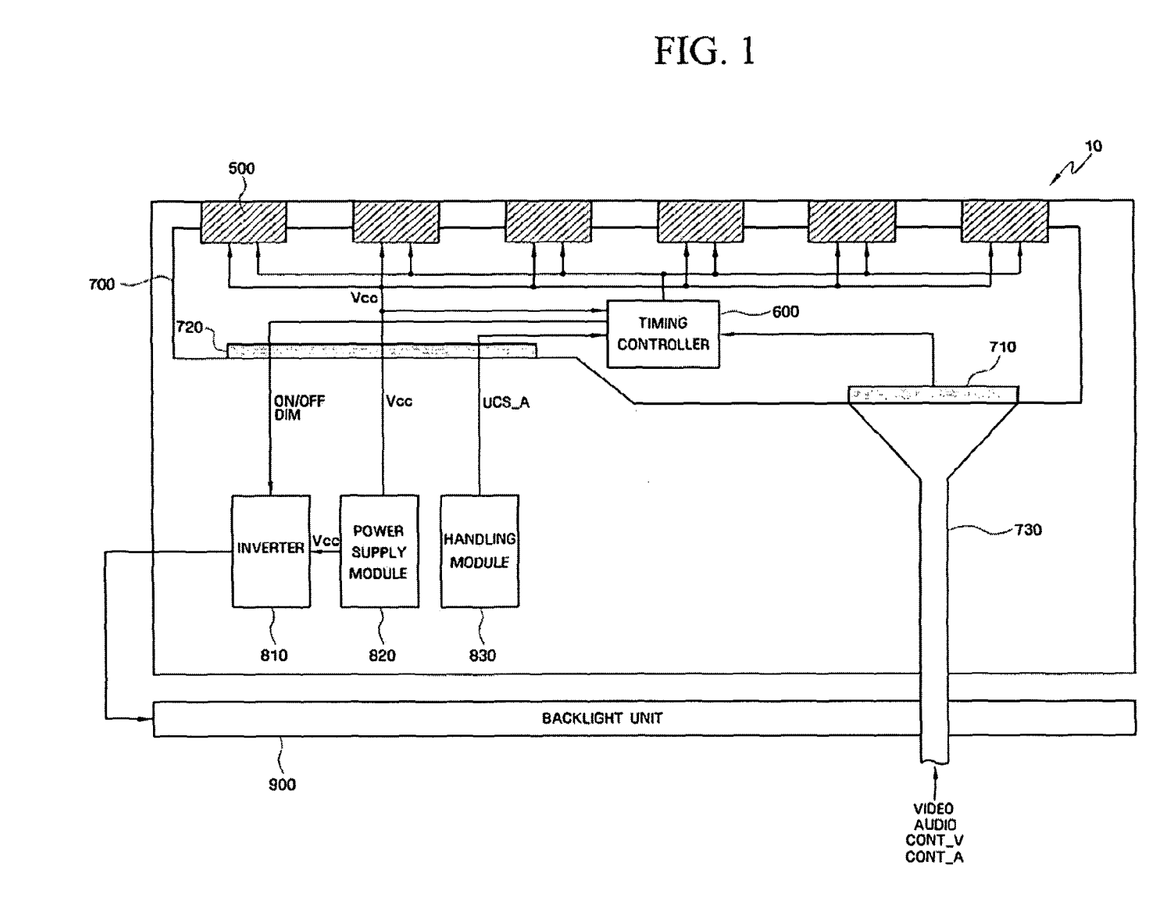
FIG. 1 is a rear view of a liquid crystal display (LCD) for explaining a timing controller, an LCD including the timing controller, and a method of driving the LCD according to an exemplary embodiment of the present invention.
Figure 2:
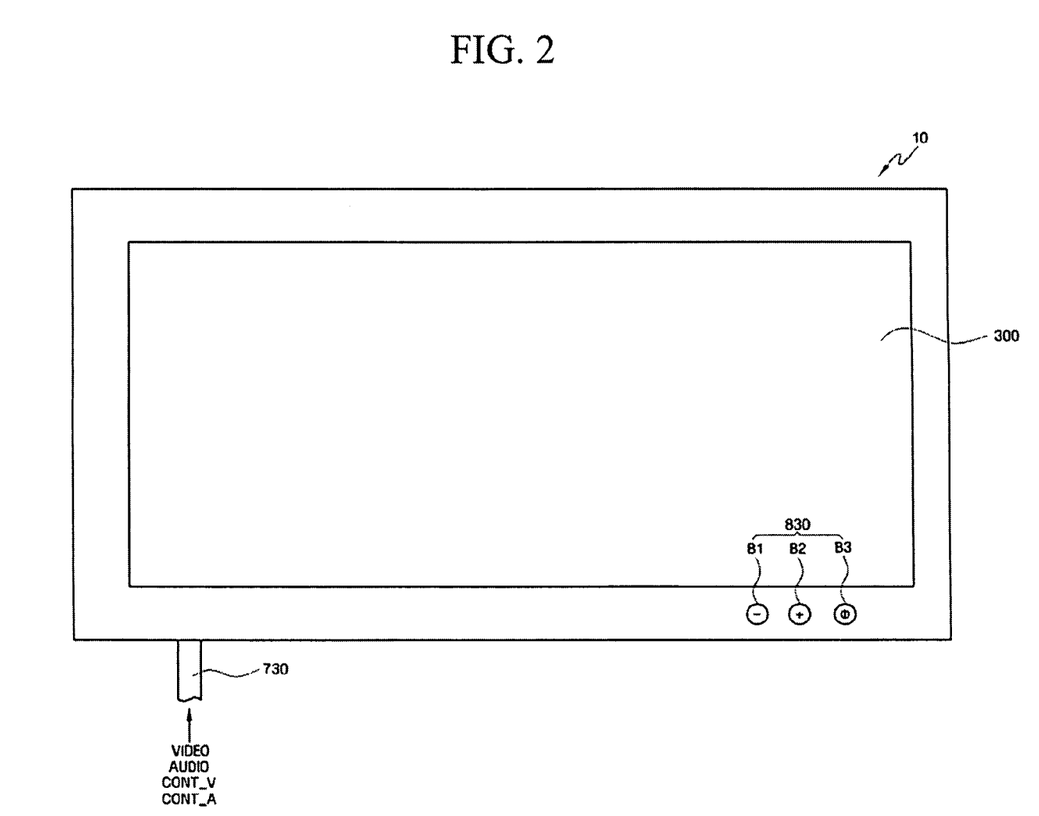
FIG. 2 is a front view of the LCD illustrated in FIG. 1.
Figure 3:
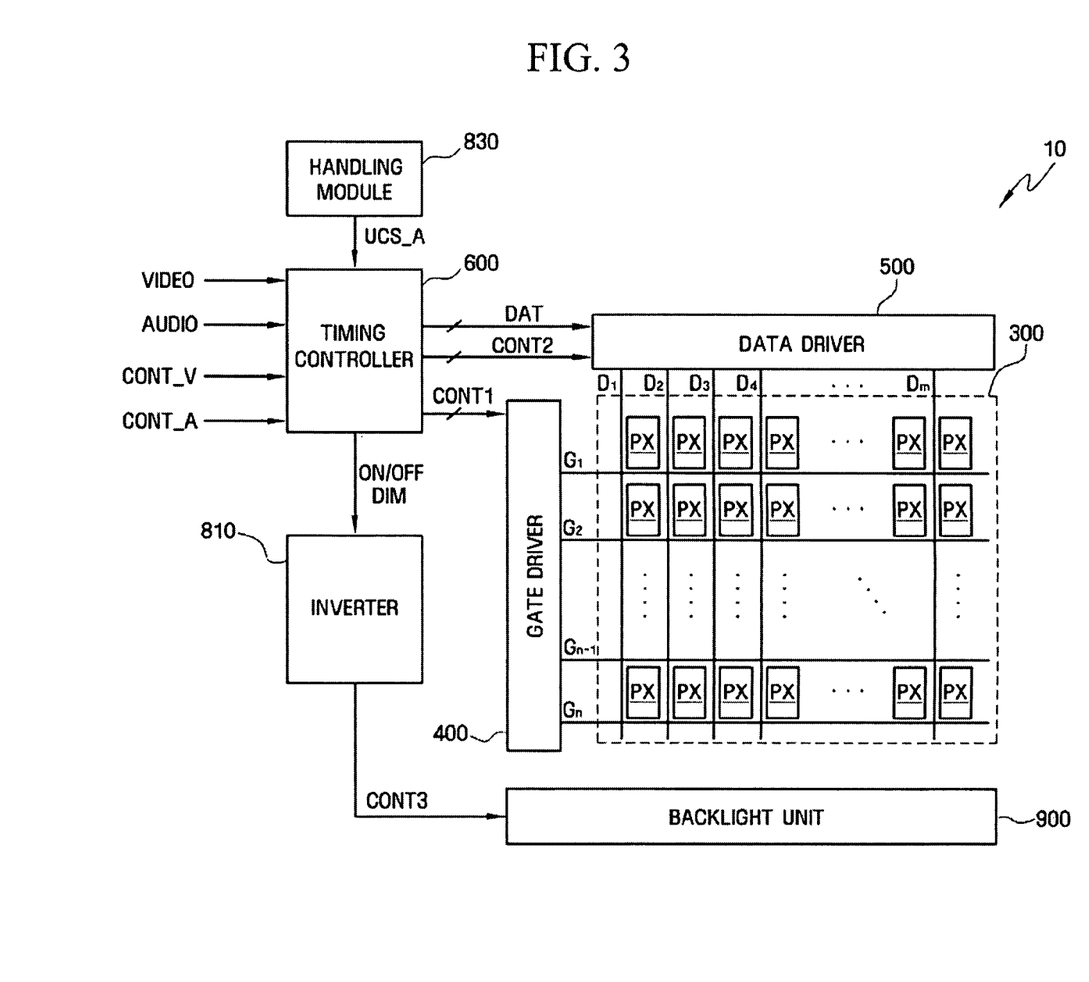
FIG. 3 is a schematic block diagram of the LCD illustrated in FIG. 1.
Figure 4:
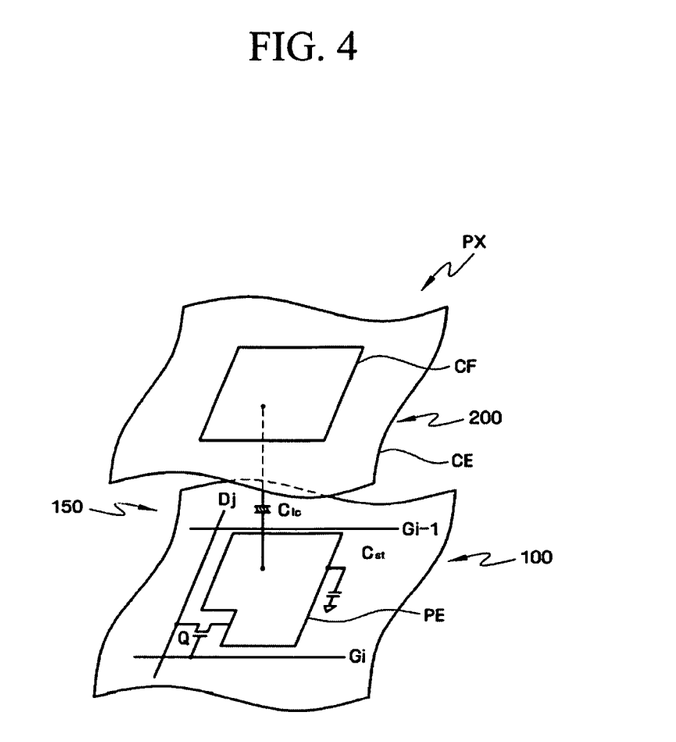
FIG. 4 is an equivalent circuit diagram of a pixel illustrated in FIG. 3.
Figure 5A:
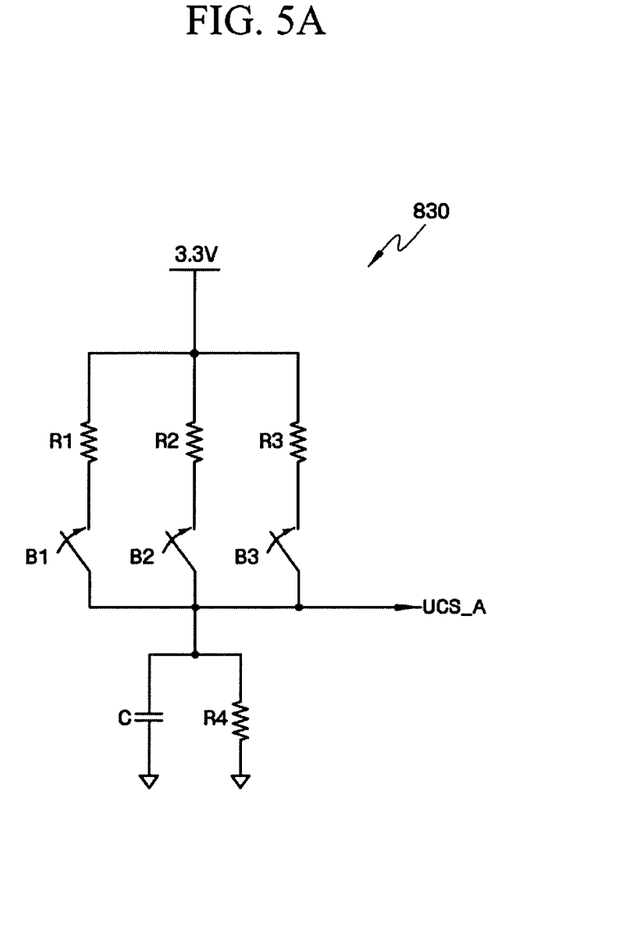
FIG. 5A is a circuit diagram of a handling module illustrated in FIG. 3.
Figure 5B:
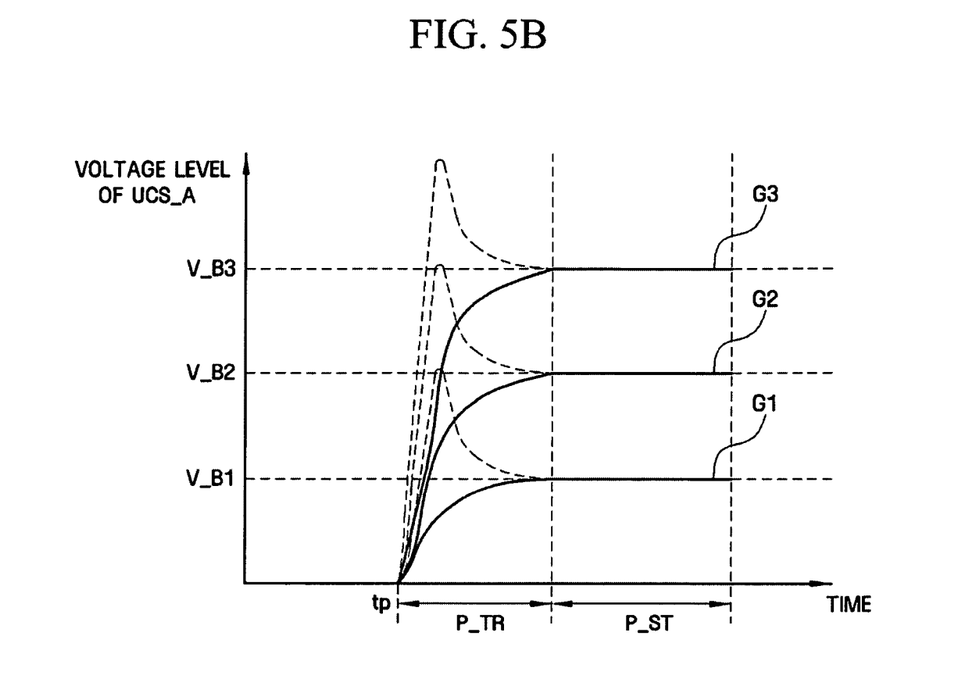
FIG. 5B is a graph for explaining the operation of the handling module illustrated in FIG. 5A.

Hereinafter, a timing controller, a liquid crystal display (LCD) including the timing controller, and a method of driving the LCD according to exemplary embodiments of the present invention will be described with reference to FIGS. 1 through 5B. FIG. 1 is a rear view of an LCD 10 for explaining a timing controller, an LCD including the timing controller, and a method of driving the LCD according to an exemplary embodiment of the present invention. FIG. 2 is a front view of the LCD 10 illustrated in FIG. 1. FIG. 3 is a schematic block diagram of the LCD 10 illustrated in FIG. 11. FIG. 4 is an equivalent circuit diagram of a pixel PX illustrated in FIG. 3. FIG. 5A is a circuit diagram of a handling module 720 illustrated in FIG. 3. FIG. 5B is a graph for explaining the operation of the handling module 720 illustrated in FIG. 5A. Hereinafter, an LCD based on DisplayPort, which is a digital display interface standard, will be described as an example. DisplayPort is a digital display interface standard put forth by the Video Electronics Standards Association (VESA). The present invention, however, is not limited to this example.

The structure of the LCD 10 will be described with reference to FIGS. 1 and 2. In particular, the connection relationships between the LCD 10 and an external host device (not shown) and between modules included in the LCD 10 will be described.

The LCD 10 interfaces with the external host device (not shown) through a first connector 710. The first connector 710 is connected to a transmission cable 730 transmitting a data signal and/or a control signal that are output from the external host device (not shown) such as a computer. The data signal may include an image signal VIDEO and an audio signal AUDIO. The control signal may be an image control signal CONT_V or an audio control signal CONT_A. The image control signal CONT_V may control the brightness of an image, and the audio control signal CONT_A may control the sound volume. Alternatively, the control signal may be a monitor control command set (MCCS) standardized by the VESA. That is, the data signal and the control signal may be signals used in DisplayPort, which is a digital display interface standard.

The modules included in the LCD 10 interface with each other through a second connector 720. That is, a timing controller 600 is electrically connected to an inverter 810, a power supply module 820, and a handling module 830 by the second connector 720.

Specifically, the power supply module 820 is connected to the second connector 720. The power supply module 820 receives an external voltage, for example, an alternating current (AC) voltage, and generates a power supply voltage Vcc, for example, 5 V of direct current (DC) voltage, used in each module of the LCD 10. The power supply module 820 applies the power supply voltage Vcc to the timing controller 600, a data driver 500 and other circuits (not shown), which are mounted on a circuit board 700, through the second connector 720. The power supply module 820 also applies the power supply voltage Vcc to the inverter 810. The power supply voltage Vcc generated by the power supply module 820 may not be applied directly to the timing controller 600, the data driver 500, and other circuits (not shown). Instead, the power supply voltage Vcc may be converted into another voltage by a voltage converter (not shown) and then applied to the timing controller 600, the data driver 500, and other circuits (not shown).

The handling module 830 and the inverter 810 may be connected to the second connector 720 and interface with the timing controller 600 through the second connector 720.

As illustrated in FIG. 2, the handling module 830 may be implemented as buttons B1, B2, and B3 on a front surface of the LCD 10 and may generate a user command signal UCS_A according to a user's operation of the buttons B1, B2, and B3. Alternatively, the handling module 830 may be a keyboard (not shown). The timing controller 600 receives the user command signal UCS_A and outputs a module control signal, for example, a dimming signal DIM or an on/off signal ON/FF, corresponding to the received user command signal UCS_A through the second connector 720. For example, when the user command signal UCS_A is a signal for commanding the on/off of the backlight unit 900, the timing controller 600 may provide the on/off signal ON/OFF to the inverter 810 through the second connector 720. When the user command signal UCS_A is a signal for commanding the adjustment of the brightness of the backlight unit 900, the timing controller 600 may provide the dimming signal DIM to the inverter 810 through the second connector 720. The user command signal UCS_A may also be a signal for commanding the adjustment of the volume of an audio output from the LCD 10.

The inverter 810 receives the dimming signal DIM or the on/off signal ON/OFF from the timing controller 600 through the second connector 720 and controls the brightness and on/off of the backlight unit 900.

The structure and operation of each module of the LCD 10 will now be described in more detail with reference to FIGS. 3 through 5B.

From the perspective of an equivalent circuit, a liquid crystal panel 300 includes a plurality of display signal lines and a plurality of pixels PX which are connected to the display signal lines and arranged in a matrix pattern. Referring to FIG. 4, the liquid crystal panel 300 includes a first display plate 100 and a second display plate 200, which face each other, and a liquid crystal layer 150 interposed between the first and second display plates 100 and 200.

The display signal lines include a plurality of gate lines G1 through Gn transmitting a plurality of gate signals, and a plurality of data lines D1 through Dm transmitting a plurality of data signals. The gate lines G1 through Gn extend substantially parallel to each other in an approximately row direction, and the data lines D1 through Dm extend substantially parallel to each other in an approximately column direction.

Referring to FIG. 4, for example, a pixel PX connected to an $i^{th}$ (i=1~n) gate line Gi and a $j^{th}$ (j=1~m) data line Dj, includes a switching device Q, which is connected to the $i^{th}$ gate line Gi and the $j^{th}$ data line Dj, and a liquid crystal capacitor. The liquid crystal capacitor is composed of a pixel electrode PE formed on the first display plate 100, a common electrode CE formed on the second display plate 200, and the liquid crystal layer 150 interposed between the pixel electrode PE and the common electrode CE. A color filter CF may be formed in a region of the second display plate 200. The pixel PX may further include a storage capacitor Cst.

In response to a gate control signal CONT1 transmitted from the timing controller 600, a gate driver 400 transmits the gate signals to the gate lines G1 through Gn.

The data driver 500 is connected to the data lines D1 through Dm of the liquid crystal panel 300. Accordingly, the data driver 500 selects a gradation voltage corresponding to an image data DAT and applies the selected gradation voltage to the pixel PX in response to a data control signal CONT2.

The gate driver 400 or the data driver 500 may be directly mounted on a liquid crystal panel assembly 300 in the form of a plurality of driving integrated circuit (IC) chips or may be mounted on a flexible printed circuit film (not shown) and, thus, attached to the liquid panel assembly 300 in the form of a tape carrier package. Otherwise, the gate driver 400 or the data driver 500 may be integrated onto the liquid crystal panel assembly 300, together with the display signal lines, that is, the gate lines G1 through Gn and the data lines D1 through Dm, and the switching device Q. In FIG. 1, only the data driver 500 is shown directly mounted on the liquid crystal panel assembly 300 in the form of driving IC chips.

The timing controller 600 receives the data signal, that is, the image signal VIDEO or the audio signal AUDIO) and/or the control signal, that is, the image control signal CONT_V or the audio control signal CONT_A, and generates the gate control signal CONT1 and the data control signal CONT2. Then, the timing controller 600 transmits the gate control signal CONT1 to the gate driver 400 and transmits the data control signal CONT2 and the image signal DAT to the data driver 500.

In addition, the timing controller 600 receives the user command signal UCS_A from the handling module 830 and outputs the module control signal. As described above, the module control signal is provided to the inverter 810 and may be the dimming signal DIM or the on/off signal ON/FF. The inverter 810 receives the on/off signal ON/OFF or the dimming signal DIM and controls the backlight unit 900. When the LCD 10 further includes an audio output module (not shown) such as a speaker (not shown), the module control signal may be a signal for controlling the volume of the audio output from the audio output module (not shown).

The handling module 830 outputs the user command signal UCS_A whose voltage level is adjusted according to a user's handling. That is, the timing controller 600 outputs the module control signal, for example, the dimming signal DIM or the on/off signal ON/FF, according to the voltage level of the user command signal UCS_A.

The handling module 830 will now be described in more detail with reference to FIGS. 5A through 5B. In this exemplary embodiment, a case where the handling module 830 has three buttons, that is, first, second, and third buttons, B1, B2, and B3, implemented on the LCD 10 as illustrated in FIG. 2 will be described as an example. The present invention, however, is not limited to this example, and the handling module 830 may include a greater number of buttons. In addition, the handling module 830 may be a keyboard or a wired/wireless remote control, instead of the first, second, and third buttons B1, B2, and B3 implemented on the LCD 10.

Referring to FIG. 5A, the handling module 830 includes first, second, third, and fourth resistors R1, R2, R3, and R4 and a capacitor C. Each of the first, second, and third buttons B1, B2, and B3 illustrated in FIG. 2 functions as a switch.

When a user presses the first button B1, the first resistor R1, the fourth resistor R4 and the capacitor C form an R-C circuit. A voltage charged in the capacitor C is output as the user command signal UCS_A, because the user command signal UCS_A is an analog signal, it will hereinafter be referred to as an analog user command signal for convenience of description. The voltage charged in the capacitor C, that is, the analog user command signal UCS_A, may be a solid line of a first graph G1 illustrated in FIG. 5B. Alternatively, the analog user command signal UCS_A may be a dotted line of the first graph G1 that has overshoot according to an internal circuit configuration of the handling module 830. More specifically, from a time tp when the user presses the first button B1, the analog user command signal UCS⁻A has a transient response section P_TR in which a voltage level of the analog user command signal UCS_A transits from, for example, 0 V to a first voltage level V_B1. The transient response section P_TR is followed by a steady-state section P_ST in which the voltage level of the analog user command signal UCS_A is maintained at the first voltage level V_B1, which has a predetermined tolerance margin, for a predetermined period of time. In the steady-state section P_ST, the analog user command signal UCS_A has the first voltage level V_B1. The first voltage level V_B1 has a value obtained after 3.3 V is divided by the first resistor R1 and the fourth resistor R4, that is, 3.3V×R4/(R1+R4). For example, the first voltage level V_B1 may be 0.83 V due to the values of the first resistor R1 and the fourth resistor R4. Because the first voltage level V_B1 can have a predetermined tolerance margin, it may be 0.63 V to 1.03 V. When receiving the first voltage level V_B1 of 0.63 V to 1.03 V, the timing controller 600 can recognize that the user has pressed the first button B1.

When the user presses the second button B2, the second resistor R2, the fourth resistor R4 and the capacitor C form another R-C circuit. In this case, if the second resistor R2 has a smaller resistance value than the first resistor R1, the analog user command signal UCS_A may be represented by a second graph G2 illustrated in FIG. 5B. That is, from the time tp when the user presses the second button B2, the analog user command signal UCS_A has the transient response section P_TR in which the voltage level of the analog user command signal UCS_A transits from, for example, 0 V to a second voltage level V_B2. The transient response section P_TR is followed by the steady-state section P_ST in which the voltage level of the analog user command signal UCS_A is maintained at the second voltage level V_B2 of 3.3V×R4/(R2+R4) for a predetermined period of time. For example, the second voltage level V_B2 may be 1.65 V due to values of the second resistor R2 and the fourth resistor R4. Because the second voltage level V_B2 can have a predetermined tolerance margin, it may be 1.45 V to 1.85 V. When receiving the second voltage level V_B2 of 1.45 V to 1.85 V, the timing controller 600 can recognize that the user has pressed the second button B2.

Similarly, when the user presses the third button B3, the third resistor R3, the fourth resistor R4 and the capacitor C form another R-C circuit. In this case, if the third resistor R3 has a smaller resistance value than the second resistor R2, the analog user command signal UCS_A may be represented by a third graph G3 illustrated in FIG. 5B. That is, from the time tp when the user presses the third button B3, the analog user command signal UCS_A has the transient response section P_TR in which the voltage level of the analog user command signal UCS_A transits from, for example, 0 V to a third voltage level V_B3. The transient response section P_TR is followed by the steady-state section P_ST in which the voltage level of the analog user command signal UCS_A is maintained at the third voltage level V_B3 of 3.3V×R4/(R3+R4) for a predetermined period of time. For example, the third voltage level V_B3 may be 1.65 V due to values of the third resistor R3 and the fourth resistor R4. Because the third voltage level V_B3 can have a predetermined tolerance margin, it may be 2.28 V to 2.68 V. When receiving the third voltage level V_B3 of 2.28 V to 2.68 V, the timing controller 600 can recognize that the user has pressed the third button B3.

In summary, the handling module 830 outputs the analog user command signal UCS_A having any one of the first voltage level V_B1, the second voltage level V_B2 and the third voltage level V_B3 according to a user's operation of the handling module 830. In each case, the analog user command signal UCS_A has the transient response section P_TR and the stead state section P_ST.

The timing controller 600 outputs the module control signal, for example, the dimming signal DIM or the on/off signal ON/OFF, according to the voltage level of the analog user command signal UCS_A. For example, when receiving the analog user command signal UCS_A having the first voltage level V_B1, the timing controller 600 may output the dimming signal DIM for decreasing the screen brightness. When receiving the analog user command signal UCS_A having the second voltage level V_B2, the timing controller 600 may output the dimming signal DIM for increasing the screen brightness. When receiving the analog user command signal UCS_A having the third voltage level V_B3, the timing controller 600 can output the on/off signal ON/OFF. More specifically, the timing controller 600 ignores the analog user command signal UCS_A during the transient response section P_TR and outputs the module control signal according to the voltage level of the analog user command signal in the stead state section P_ST, thereby reducing malfunctions.

The timing controller 600, the LCD 10 including the timing controller 600, and a method of driving the LCD 10 will be described in more detail in the following exemplary embodiments.

Figure 6:
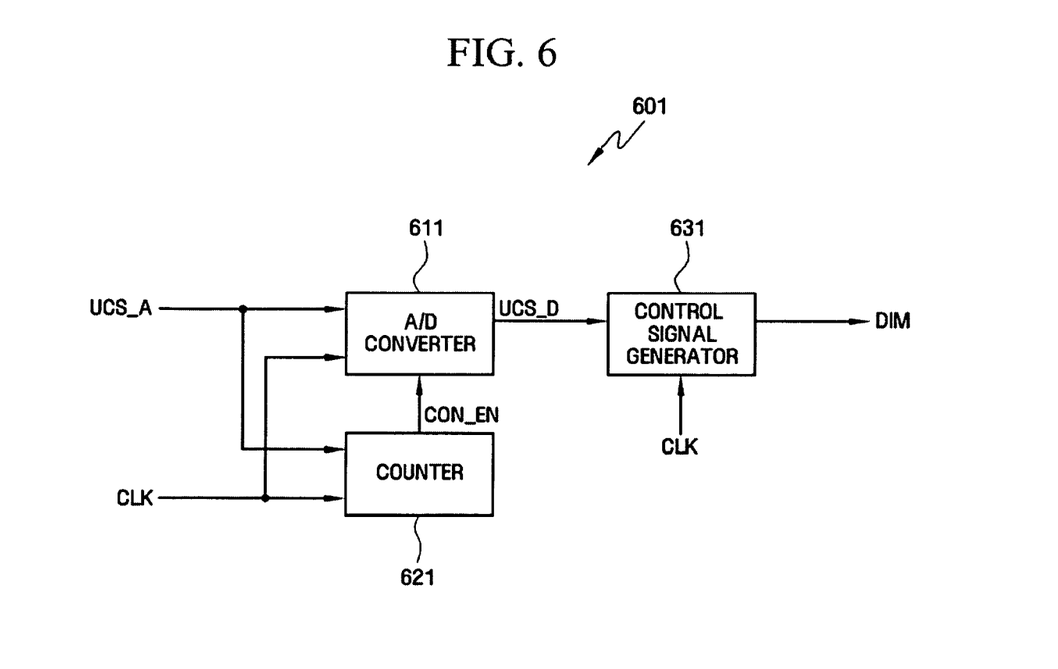
FIG. 6 is a block diagram for explaining a timing controller, an LCD including the timing controller and a method of driving the LCD according to an exemplary embodiment of the present invention.
Figure 7:
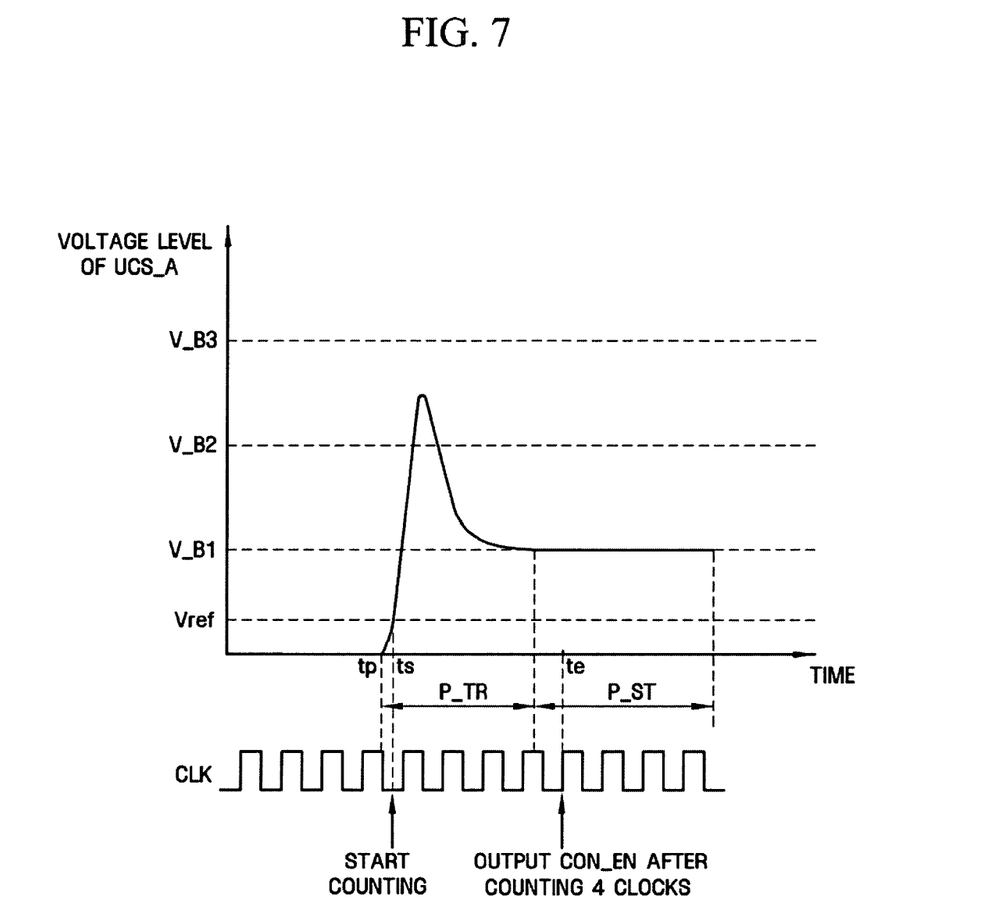
FIG. 7 is a signal diagram for explaining the operation of the timing controller illustrated in FIG. 6.

A timing controller, an LCD including the timing controller, and a method of driving the LCD according to an exemplary embodiment of the present invention will now be described with reference to FIGS. 6 and 7. FIG. 6 is a block diagram for explaining a timing controller 601, an LCD including the timing controller 601 and a method of driving the LCD according to an exemplary embodiment of the present invention. FIG. 7 is a signal diagram for explaining the operation of the timing controller 601 illustrated in FIG. 6. The present exemplary embodiment will be described using, as an example, a case where the timing controller 601 outputs a dimming signal DIM for decreasing the brightness when a user presses a first button B1.

Referring to FIG. 6, the timing controller 601 includes an analog-to-digital (A/D) converter 611, a counter 621, and a control signal generator 631. The A/D converter 611, the counter 621 and the control signal generator 631 operate in synchronization with an internal clock signal CLK. FIG. 7 illustrates the variation in the voltage level of an analog user command signal UCS_A over time from a time tp when a user presses the first button B1 and illustrates the internal clock signal CLK and the operation of the counter 621. If the counter 621 provides a converting enable signal CON_EN in a steady-state section P_ST of the analog user command signal UCS_A, the A/D converter 611 converts the analog user command signal UCS_A in the steady-state section P_ST into a digital user command signal UCS_D. Then, the control signal generator 631 outputs the module control signal, that is, the dimming signal DIM, corresponding to the digital user command signal UCS_D. More specifically, in the present exemplary embodiment, the timing controller 601 ignores the voltage level of the analog user command signal UCS_A in the transient response section P_TR, converts the analog user command signal UCS_A in the steady-state section P_ST into the digital user command signal UCS_D, and generates a module control signal, that is, the dimming signal DIM, corresponding to the digital user command signal UCS_D, which will be described in more detail with reference to FIG. 7.

In FIG. 7, a case where the transient response section P_TR has overshoot is illustrated as an example. From the time tp when the user presses the first button B1, the voltage level of the analog user command signal UCS_A gradually increases from 0 V. At a time ts when the voltage level of the analog user command signal UCS_A reaches a reference voltage level Vref, the counter 621 starts to count the number of clocks of the internal clock signal CLK. After counting m clocks of the internal clock signal CLK, where m is a natural number and in FIG. 7, m=4, the counter 621 outputs the converting enable signal CON_EN at a rising edge time te of the internal clock signal CLK. Accordingly, the A/D converter 611 converts the analog user command signal UCS_A having the first voltage level V_B1 in the steady-state section P_ST into the digital user command signal UCS_D. In addition, the control signal generator 631 receives the digital user command signal UCS_D and outputs the module control signal, for example, the dimming signal DIM for decreasing brightness. The value of m may vary according to a period of time from when the counter 621 starts its counting operation to when the analog user command signal UCS_A enters the steady-state section P_ST.

In summary, the timing controller 601 outputs the module control signal, that is, the dimming signal DIM, in response to the voltage level of the analog user command signal UCS_A in the steady-state section P_ST. Because the timing controller 601 outputs an appropriate module control signal according to the user's operations, malfunctions are reduced.

Figure 8:
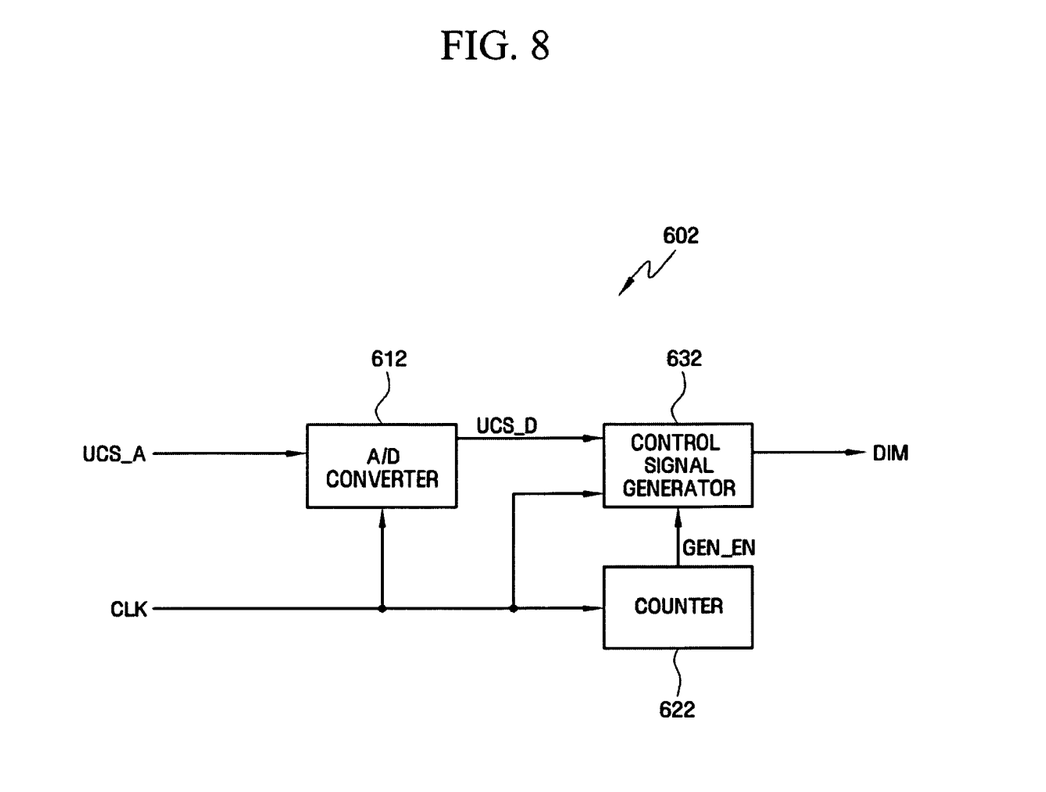
FIG. 8 is a block diagram for explaining a timing controller, an LCD including the timing controller and a method of driving the LCD according to an exemplary embodiment of the present invention.
Figure 9:
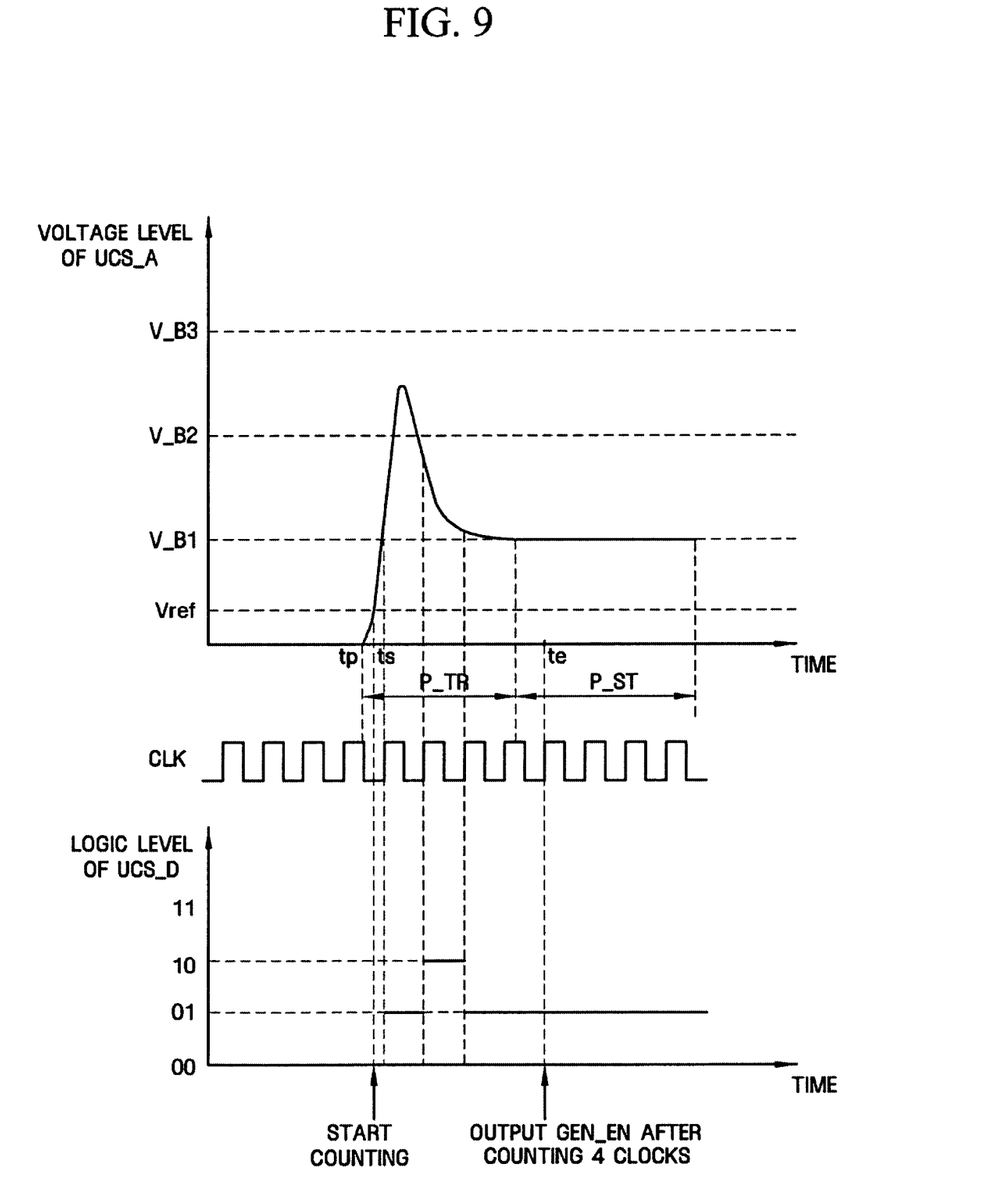
FIG. 9 is a signal diagram for explaining the operation of the timing controller illustrated in FIG. 8.

A timing controller, an LCD including the timing controller, and a method driving the LCD according to another exemplary embodiment of the present invention will now be described with reference to FIGS. 8 and 9. FIG. 8 is a block diagram for explaining a timing controller 602, an LCD including the timing controller 602, and a method of driving the LCD according to another exemplary embodiment of the present invention. FIG. 9 is a signal diagram for explaining the operation of the timing controller 602 illustrated in FIG. 8. The present exemplary embodiment will be described using, as an example, a case where the timing controller 602 outputs a dimming signal DIM for decreasing brightness when a user presses a first button B1. In addition, the present exemplary embodiment will be described based on the assumption that a first voltage level V_B1 corresponds to a logic level of "01," that a second voltage level V_B2 corresponds to a logic level of "10," and that a third voltage level V_B3 corresponds to a logic level of "11."

Referring to FIGS. 8 and 9, unlike the timing controller 601 described in connection with FIG. 6, the timing controller 602 according to the present exemplary embodiment converts an analog user command signal UCS_A in a transient response section P_TR into a digital user command signal UCS_D and converts the analog user command signal UCS_A in a steady-state section P_ST into the digital user command signal UCS_D. The timing controller 601 of FIG. 6 ignores the digital user command signal UCS_D in the transient response section P_TR and generates the module control signal, that is, the dimming signal DIM, corresponding to the digital user command signal UCS_D in the steady-state section P_ST.

More specifically, referring to FIG. 8 and FIG. 9, an A/D converter 612 is synchronized with an internal clock signal CLK and converts the analog user command signal UCS_A during the transient response time P_TR into the digital user command signal UCS_D. That is, the logic level of the digital user command signal UCS_D in the transient response section P_TR transits to 01, 11 and 10, sequentially. In synchronization with the internal clock signal CLK, the A/D converter 612 also converts the analog user command signal UCS_A in the steady-state section P_ST into the digital user command signal UCS_D. That is, the logic level of the digital user command signal UCS_D in the steady-state section P_ST is 01.

At a time ts when the voltage level of the analog user command signal UCS_A reaches a reference voltage level Vref, a counter 622 starts to count the number of clocks of the internal clock signal CLK. After counting m clocks of the internal clock signal CLK, where m is a natural number and in FIG. 9, m=4, the counter 622 outputs a generating enable signal GEN_EN at a rising edge time te of the internal clock signal CLK. Accordingly, a control signal generator 632 receives the generating enable signal GEN_EN and outputs the module control signal, for example, the dimming signal DIM for decreasing brightness, in response to the digital user command signal UCS_D having a logic level of "01" that was provided by the A/D converter 612 at the rising edge time te. The value of m may vary according to a period of time from when the counter 622 starts its counting operation to when the analog user command signal UCS_A enters the steady-state section P_ST.

In summary, the timing controller 602 outputs the module control signal, that is, the dimming signal DIM, in response to the voltage level of the analog user command signal UCS_A in the steady-state section P_ST. Since the timing controller 602 outputs an appropriate module control signal according to the user's operation, malfunctions are reduced.

As described above, a timing controller, an LCD including the timing controller, and a method of driving the LCD according to exemplary embodiments of the present invention can reduce malfunctions.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in descriptive sense only and not for purposes of limitation.

What is claimed is:

1. A liquid crystal display, LCD, comprising:
    a handling module outputting a user command signal in response to a user's operation thereof; and
    a timing controller outputting a module control signal in response to a voltage level of the user command signal in a steady-state section,
    wherein the user command signal comprises a transient response section and the steady-state section,
    wherein the timing controller comprises:
    a counter providing a converting enable signal in the steady-state section;
    an analog-to-digital, A/D, converter converting the user command signal in the steady-state section into the digital user command signal in response to the converting enable signal; and
    a control signal generator generating the module control signal that corresponds to the digital user command signal, and
    wherein the counter starts to count the number of clocks of an internal clock signal when the user command signal reaches a reference voltage level, and after counting m clocks of the internal clock signal, where m is a natural number that varies according to a period of time from when the counter starts the counting to when the user command signal enters into the steady-state section, the counter provides the converting enable signal.

2. The LCD of claim 1, wherein the timing controller ignores the voltage level of the user command signal in the transient response section.

3. The LCD of claim 1, wherein the voltage level of the user command signal in the steady-state section varies according to the user's operation.

4. The LCD of claim 1, wherein the timing controller ignores the voltage level of the user command signal in the transient response section, converts the user command signal in the steady-state section into a digital user command signal, and generates the module control signal corresponding to the digital user command signal.

5. The LCD of claim 1, further comprising: a liquid crystal panel displaying an image; and a backlight unit providing light to the liquid crystal panel, wherein the module control signal controls brightness of the backlight unit.

6. The LCD of claim 1, further comprising: a liquid crystal panel displaying an image; and a backlight unit providing light to the liquid crystal panel, wherein the module control signal controls an on/off state of the backlight unit.

7. The LCD of claim 1, further comprising at least one module interfacing with the timing controller, wherein the module control signal controls operations of the at least one module according to the user's operations.

8. A timing controller comprising:
    a counter providing a converting enable signal in a steady-state section of a user command signal, wherein the user command signal includes a transient response section and the steady-state section;
    an A/D converter converting the steady-state section of the user command signal into a digital user command signal in response to the converting enable signal; and
    a control signal generator generating a module control signal that corresponds to the digital user command signal,
    wherein the counter starts to count the number of clocks of an internal clock signal when the user command signal reaches a reference voltage level, and after counting m clocks of the internal clock signal, where m is a natural number that varies according to a period of time from when the counter starts the counting to when the user command signal enters into the steady-state section, the counter provides the converting enable signal.

9. The timing controller of claim 8, wherein the module control signal controls one of a brightness and an on/off of a backlight unit.

10. A method of driving an LCD, the method comprising:
    outputting a user command signal in response to a user's operation; and
    outputting a module control signal in response to a voltage level of the user command signal in a steady-state section,
    wherein the user command signal comprises a transient response section and the steady-state section,
    wherein the outputting of the module control signal comprises:
    converting the user command signal in the steady-state section into a digital user command signal;
    generating the module control signal corresponding to the digital user command signal; and
    starting to count the number of clocks of an internal clock signal when the user command signal reaches a reference voltage level,
    wherein the converting of the user command signal into the digital user command signal comprises:
    providing a converting enable signal in the steady-state section and after counting m clocks of the internal clock signal, wherein m is a natural number that varies according to a period of time from when the counter starts the counting to when the user command signal enters into the steady-state section; and converting the user command signal in the steady-state section into the digital user command signal in response to the converting enable signal.

11. The method of claim 10, wherein the outputting of the module control signal comprises ignoring the voltage level of the user command signal in the transient response section.

12. The method of claim 10, wherein the voltage level of the user command signal in the steady-state section varies according to the user's operation.

13. The method of claim 10, further comprising controlling one of a brightness and an on/off of a backlight in response to the module control signal.

* * * * *